(12) United States Patent
Lee

(10) Patent No.: US 8,557,662 B2
(45) Date of Patent: Oct. 15, 2013

(54) METHOD FOR FABRICATING SIDE CONTACT IN SEMICONDUCTOR DEVICE USING DOUBLE TRENCH PROCESS

(75) Inventor: Sang-Oh Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 858 days.

(21) Appl. No.: 12/649,988

(22) Filed: Dec. 30, 2009

(65) Prior Publication Data

US 2011/0129975 A1    Jun. 2, 2011

(30) Foreign Application Priority Data

Nov. 30, 2009  (KR) .................. 10-2009-0117438

(51) Int. Cl.
*H01L 21/336* (2006.01)
*H01L 21/28* (2006.01)

(52) U.S. Cl.
USPC ........... 438/270; 438/524; 438/542; 438/696; 257/E21.158

(58) Field of Classification Search
USPC .................. 438/270, 524, 542, 666, 696
See application file for complete search history.

(56) References Cited

U.S. PATENT DOCUMENTS 7,838,925 B2 * 11/2010 Roesner et al. ............... 257/328
2010/0090348 A1 * 4/2010 Park et al. ..................... 257/773

FOREIGN PATENT DOCUMENTS

KR    1020070002235    1/2007

OTHER PUBLICATIONS

Notice of Allowance issued by the Korean Intellectual Property Office on Nov. 30, 2011.

* cited by examiner

*Primary Examiner* — Alexander Ghyka
(74) *Attorney, Agent, or Firm* — IP & T Group LLP

(57) ABSTRACT

A method for fabricating a semiconductor device is provided, the method includes forming a double trench including a first trench and a second trench formed below the first trench and having surfaces covered with insulation layers, and removing portions of the insulation layers to form a side contact exposing one sidewall of the second trench.

18 Claims, 12 Drawing Sheets

METHOD FOR FABRICATING SIDE CONTACT IN SEMICONDUCTOR DEVICE USING DOUBLE TRENCH PROCESS

CROSS-REFERENCE TO RELATED APPLICATIONS

The present application claims priority of Korean Patent Application No. 10-2009-0117438, filed on Nov. 30, 2009, which is incorporated herein by reference in its entirety.

BACKGROUND OF THE INVENTION

Exemplary embodiments of the present invention relate to a method for fabricating a semiconductor device, and more particularly, to a method for fabricating a side contact in a semiconductor device using a double trench process.

Pattern micronization is the core of yield improvement. Mask processes are also requiring smaller sizes due to the pattern micronization. Thus, argon fluoride (ArF) photoresist has been introduced in semiconductor devices at the 40 nm level or less. Yet, the ArF photoresist is reaching the limits as even more micronized patterns are desired.

As a result, a new patterning technology is in demand for memory devices, such as dynamic random access memory (DRAM). Accordingly, a technology for forming a three-dimensional cell has been introduced.

A metal-oxide-semiconductor field effect transistor (MOSFET) having a typical planar channel exhibits physical limitations as to leakage current, power-on current, and short channel effect caused by micronization of a memory device. Thus, it is becoming difficult to further micronize devices. To overcome such difficulties, research has been conducted to develop semiconductor devices using a vertical channel.

A semiconductor device having a vertical channel includes forming an active region having a pillar shape extending vertically from a substrate and surround type gate electrodes, also referred to as vertical gates, enclosing the active region. The semiconductor device having a vertical channel also includes forming junction regions, such as source regions and drain regions, in upper and lower regions of the active region with the gate electrodes at the center. Buried bit lines are coupled to one of the junction regions.

FIG. 1 illustrates a cross-sectional view of a typical semiconductor device including a vertical channel.

Referring to FIG. 1, a plurality of pillar structures are formed over a substrate 11. The pillar structures include active regions 12 and hard mask layers 13 extending in a vertical direction. Gate insulation layers 14 and vertical gates 15 are surrounding outer sidewalls of the active regions 12. Buried bit lines 16 are formed in the substrate 11 by implanting impurity ions. Inter-layer insulation layers 18 are buried over trenches 17 isolating adjacent buried bit lines 16.

However, the typical method shown in FIG. 1 includes implanting dopants by performing an ion implantation process to form the buried bit lines 16. When a semiconductor device is miniaturized, dopant implantation alone may not be satisfactory in reducing a resistance of the buried bit lines 16. Thus, device characteristics may be deteriorated.

Accordingly, a technology for forming buried bit lines with metal layers to reduce a resistance has been recently introduced. In this technology, ohmic-like contacts are formed between active regions and buried bit lines because the buried bit lines include metal layers.

To form ohmic-like contacts, a side contact process which exposes one sidewall of an active region is needed.

A side contact is formed on a portion of one sidewall of an active region to couple the active region and buried bit lines because the height of the buried bit lines is small.

However, as the integration scale increases, the width of active regions has decreased and the depth has deepened. Thus, it has become difficult to form a side contact which selectively exposes one sidewall of an active region. Furthermore, even if side contacts are formed, it is difficult to form the side contacts with an even depth.

SUMMARY OF THE INVENTION

Exemplary embodiments of the present invention are directed to a method for fabricating a semiconductor device, which can form a side contact that selectively exposes one sidewall of an active region with ease, and form side contacts to an even depth.

In accordance with an embodiment of the present invention, a method for fabricating a semiconductor device includes forming a double trench including a first trench and a second trench formed below the first trench and having surfaces covered with insulation layers, and removing portions of the insulation layers to form a side contact exposing a portion of one sidewall of the second trench.

The second trench may have a depth smaller than that of the first trench.

The removing of portions of the insulation layers to form the side contact may include forming a sacrificial layer over the insulation layers to gap-fill the double trench, etching portions of the sacrificial layer to form a recess exposing the insulation layers formed on one sidewall of the double trench, and removing portions of the insulation layers exposed by the recess and exposing a portion of one sidewall of the second trench.

The removing of portions of the insulation layers to form the side contact may include exposing a portion of the one sidewall of the second trench in a line shape.

In accordance with another embodiment of the present invention, a method for fabricating a semiconductor device includes forming a plurality of active regions isolated from each other by double trenches, including first trenches and second trenches formed below the first trenches and having surfaces covered with insulation layers, removing portions of the insulation layers to form side contacts exposing a portion of one sidewall of each of the second trenches, and forming junction regions in the active regions adjacent to a portion of the one sidewall of each of the second trenches.

The second trenches may have a depth smaller than that of the first trenches.

The removing of portions of the insulation layers to form the side contacts may include forming a sacrificial layer over the insulation layers to gap-fill the double trenches, etching portions of the sacrificial layer to form recesses exposing the insulation layers formed on one sidewall of each of the double trenches, and removing portions of the insulation layers exposed by the recess and exposing a portion of the one sidewall of each of the second trenches.

The removing of portions of the insulation layers to form the side contacts may include exposing a portion of the one sidewall of each of the second trenches in a line shape.

The forming of the junction regions may include forming a dopant supply layer doped with dopants to gap-fill the double trenches, and diffusing the dopants using an anneal process to form the junction regions.

The dopant supply layer may include a doped polysilicon layer.

The forming of the junction regions may include performing a tilted ion implantation process.

In accordance with another embodiment of the present invention, a method for fabricating a semiconductor device includes etching a substrate to form a first trench, forming a first insulation layer on sidewalls of the first trench, etching a bottom surface of the first trench to form a second trench, forming a second insulation layer over the substrate structure, and etching portions of the second insulation layer to form a side contact exposing a portion of one sidewall of the second trench.

A plurality of active regions isolated from each other by the first trench and the second trench may be formed.

The method may further includes forming a junction region in the active region adjacent to a portion of the one sidewall exposed by the side contact.

The forming of the junction region may include forming a dopant supply layer doped with dopants, and diffusing the dopants using an anneal process to form the junction region.

The dopant supply layer may include a doped polysilicon layer.

The forming of the junction region may include performing a tilted ion implantation process.

The etching of portions of the second insulation layer to form the side contact may include forming a sacrificial layer over the second insulation layer to gap-fill the first trench and the second trench, planarizing the sacrificial layer, etching portions of the sacrificial layer, after the planarizing, to form a recess using a contact mask, and removing the remaining sacrificial layer and portions of the second insulation layer.

The sacrificial layer may include an undoped polysilicon layer.

Each of the first insulation layer and the second insulation layer may include a stack structure of a liner oxide layer and a liner nitride layer.

The method may further include forming a buried bit line buried over the second trench and coupled to the junction region, after the forming of the junction region.

The forming of the buried bit line may include forming a barrier metal layer, forming a metal silicide on an interface between the junction region and the barrier metal layer, forming a metal layer over the barrier metal layer to fill the first trench and the second trench, and performing an etch-back process on the metal layer.

DESCRIPTION OF SPECIFIC EMBODIMENTS

Figure 1:
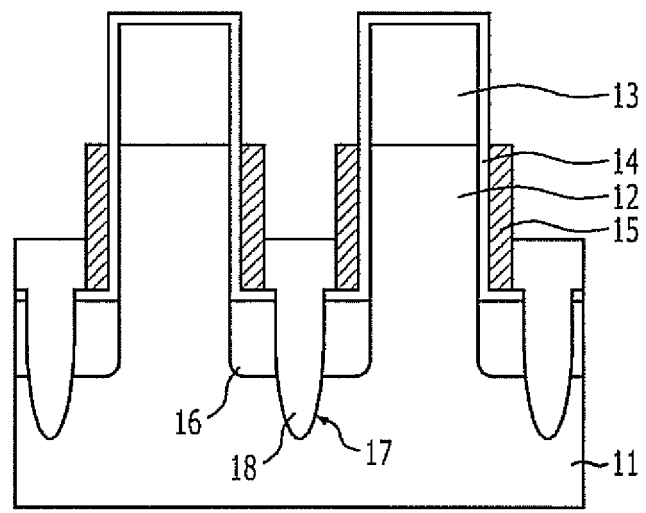
FIG. 1 illustrates a cross-sectional view of a typical semiconductor device including a vertical channel.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIGS. 2A to 2L illustrate cross-sectional views of a method for fabricating a semiconductor device in accordance with an embodiment of the present invention.

Figure 2A:
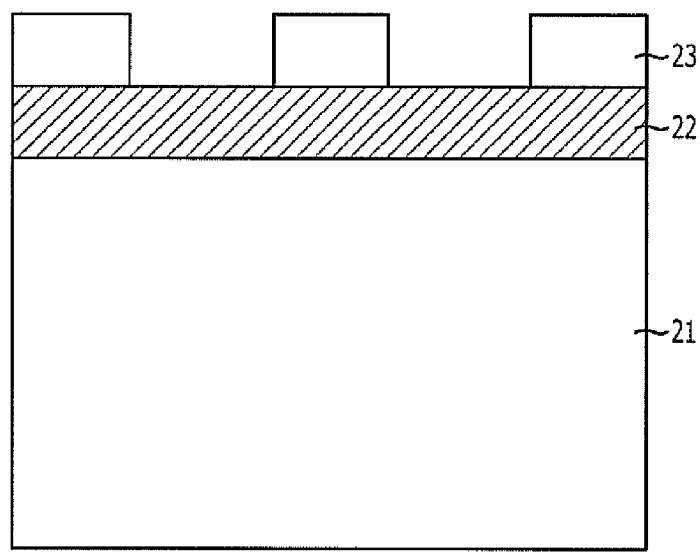
FIGS. 2A to 2L illustrate cross-sectional views of a method for fabricating a semiconductor device in accordance with an embodiment of the present invention.

Referring to FIG. 2A, a first hard mask layer 22 is formed over a substrate 21. The substrate 21 includes a silicon substrate. The first hard mask layer 22 may include one of an oxide-based layer, a nitride-based layer, and a stack structure of a nitride-based layer and an oxide-based layer. For instance, the first hard mask layer 22 may include a stack structure of a hard mask nitride layer and a hard mask oxide layer.

A first photoresist pattern 23 is formed over the first hard mask layer 22. The first photoresist pattern 23 is patterned in a line-space form. The first photoresist pattern 23 is also referred to as a buried bit line mask.

Figure 2B:
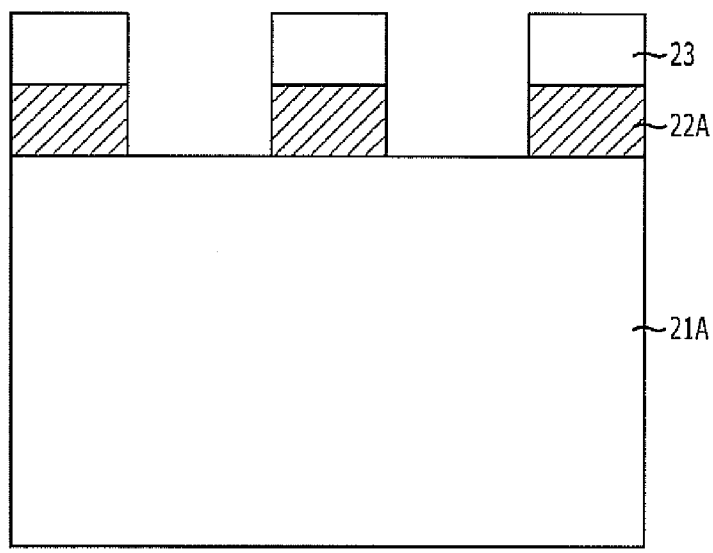

Referring to FIG. 2B, the first hard mask layer 22 is etched using the first photoresist pattern 23 as an etch barrier. Consequently, a first hard mask pattern 22A is formed. The first hard mask pattern 22A is also patterned in a line-space form because the first hard mask pattern 22A mirrors the shape of the first photoresist pattern 23.

Figure 2C:
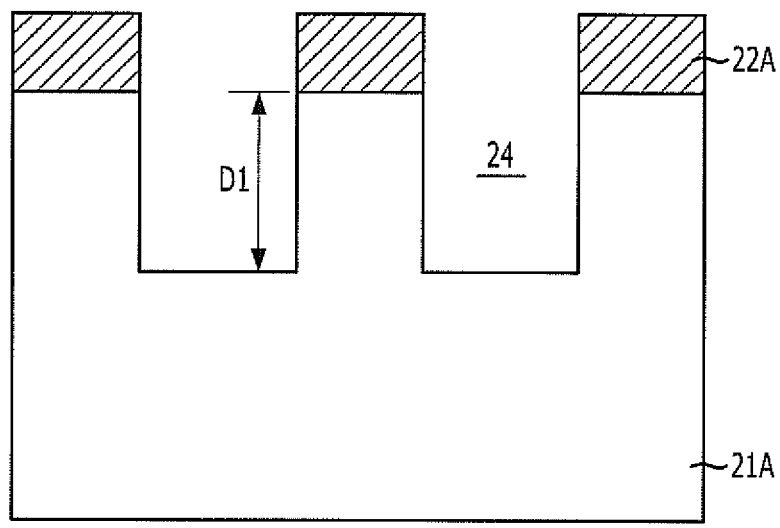

Referring to FIG. 2C, the first photoresist pattern 23 is removed, and a first trench etch process is performed using the first hard mask pattern 22A as an etch barrier. That is, the substrate 21 is etched to a certain depth using the first hard mask pattern 22A as an etch barrier to form first trenches 24 having a first depth D1 of approximately 1,800 Å. The remaining substrate 21 after the first trench etch process is performed is referred to as an etched substrate 21A.

Such trench etch process is referred to as a buried bit line trench etch process.

The first trenches 24 are also patterned in a line-space form because the first trenches 24 are formed using the first hard mask pattern 22A, which mirror the shape of the first photoresist pattern 23. Consequently, the first trenches 24 are formed in a line shape.

The buried bit line trench etch process includes performing an anisotropic etching process or a plasma dry etching process. When the substrate 21 includes a silicon substrate, the anisotropic etching process may include using one of chlorine ($Cl_2$) gas and hydrogen bromide (HBr) gas, while the plasma dry etching process may include using a mixture of $Cl_2$ gas and HBr gas.

Figure 2D:
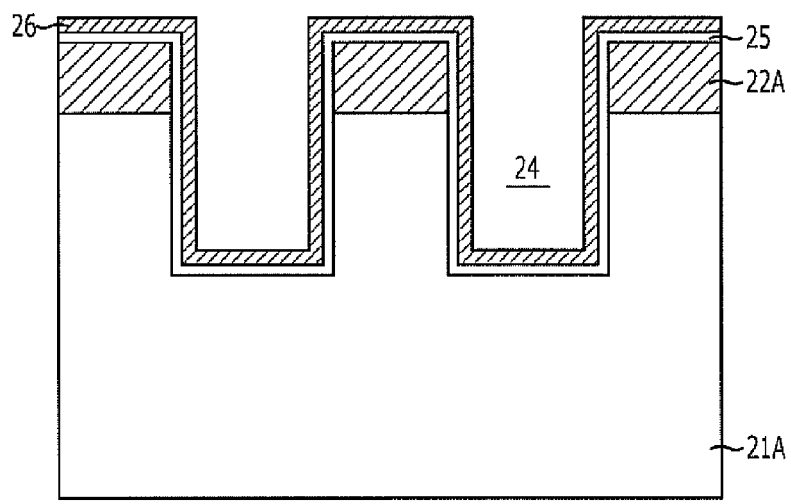

Referring to FIG. 2D, a first liner oxide layer 25 and a first liner nitride layer 26 are formed over the substrate structure. The first liner oxide layer 25 may be formed using a wall oxidation process. The first liner nitride layer 26 may be formed in an ambient dichlorosilane (DCS) and ammonia ($NH_3$) atmosphere at a temperature ranging from approximately 600° C. to approximately 800° C. and at a pressure ranging from approximately 0.1 Torr to approximately 6 Torr.

Figure 2E:
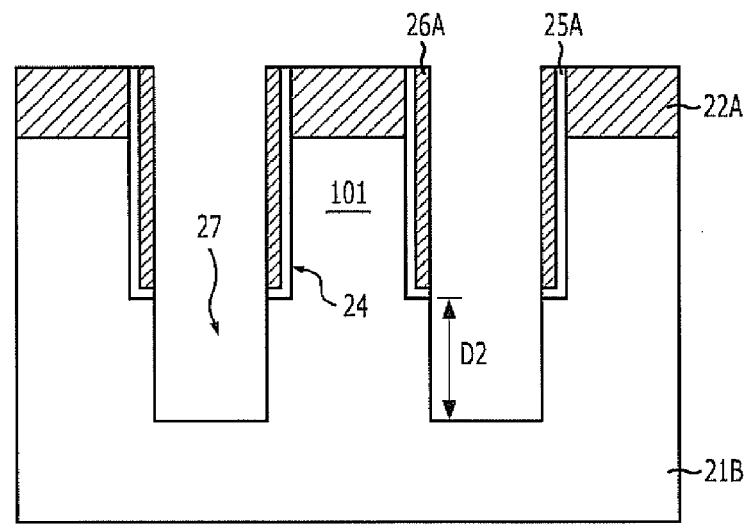

Referring to FIG. 2E, a second trench etch process is performed to form second trenches 27. The second trench etch process includes etching portions of the first liner nitride layer 26 and the first liner oxide layer 25 formed over upper portions of the first hard mask pattern 22A and bottom portions of the first trenches 24. The second trench etch process etches the bottom portions of the first trenches 24 to a second depth D2 of approximately 1,000 Å. After the first liner nitride layer 26 and the first liner oxide layer 25 are etched, first liner nitride patterns 26A and first liner oxide patterns 25A remain on sidewalls of the first trenches 24 and the first hard mask pattern 22A. The second trenches 27 are formed in a line shape, and aligned with sidewalls of the first liner nitride patterns 26A. The depth of the second trenches 27 is smaller than that of the first trenches 24 (D2<D1).

When the second trenches 27 are formed, a plurality of active regions 101 isolated from each other by double trenches, including the first trenches 24 and the second trenches 27, are formed in a remaining substrate 21B. The active regions 101 are formed in a line type pillar structure each having two sidewalls including one sidewall and another sidewall.

Figure 2F:
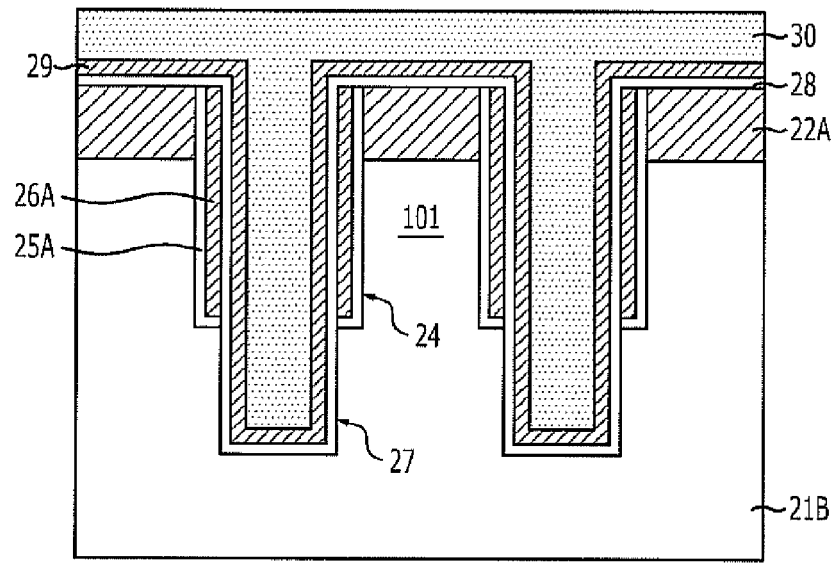

Referring to FIG. 2F, a second liner oxide layer 28 and a second liner nitride layer 29 are formed over the substrate structure 21B. The second liner oxide layer 28 may be formed using a wall oxidation process. The second liner nitride layer 29 may be formed in an ambient DCS and $NH_3$ atmosphere at a temperature ranging from approximately 600° C. to approximately 800° C. and at a pressure ranging from approximately 0.1 Torr to approximately 6 Torr.

A sacrificial layer 30 is formed over the second liner nitride layer 29 in a manner to gap-fill the second trenches 27. The sacrificial layer 30 is to be removed after subsequent processes are performed. For instance, the sacrificial layer 30 may include an updoped polysilicon layer.

Figure 2G:
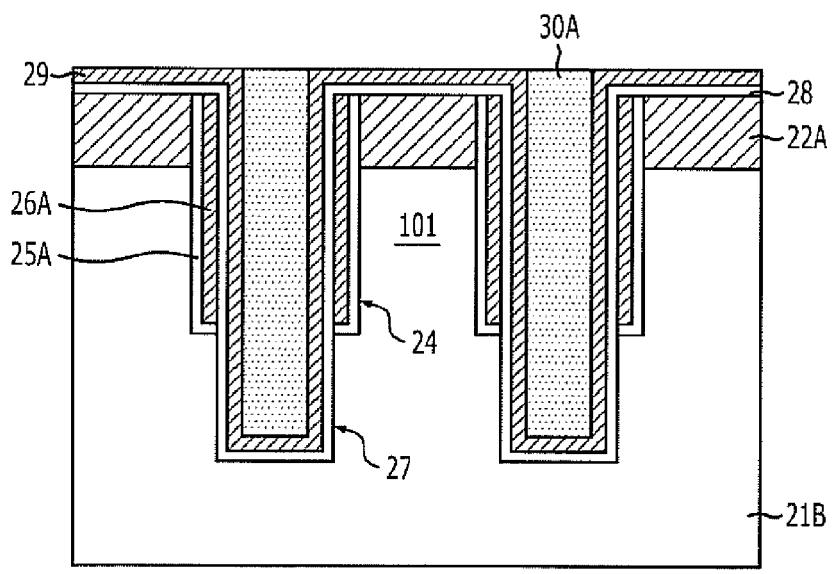

Referring to FIG. 2G, the sacrificial layer 30 is planarized using a chemical mechanical polishing (CMP) process until surfaces of the second liner nitride layer 29 formed over the upper portions of the first hard mask pattern 22A are exposed. Consequently, sacrificial patterns 30A are formed. When planarizing the sacrificial layer 30 using the CMP process, a high selectivity slurry with respect to nitride is applied because the sacrificial layer 30 includes an undoped polysilicon layer.

Figure 2H:
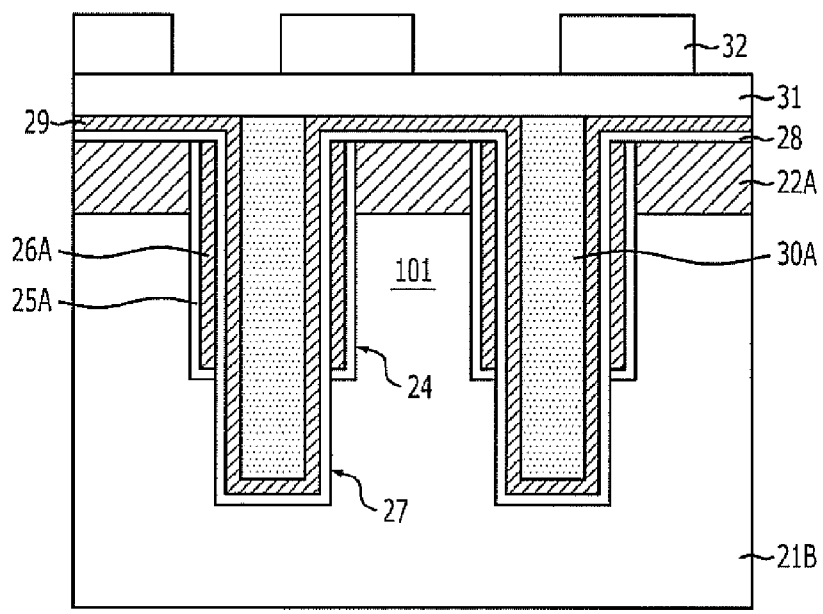

Referring to FIG. 2H, a second hard mask layer 31 is formed, and a second photoresist pattern 32 is formed using a photoresist layer. The second hard mask layer 31 may include a carbon layer.

The second photoresist pattern 32 is to be used as a contact mask for subsequently etching portions of the sacrificial patterns 30A to expose one of the sidewalls of the active regions 101. Such contact mask for exposing one sidewall of an active region may be referred to as a one side contact (OSC) mask.

Figure 2I:
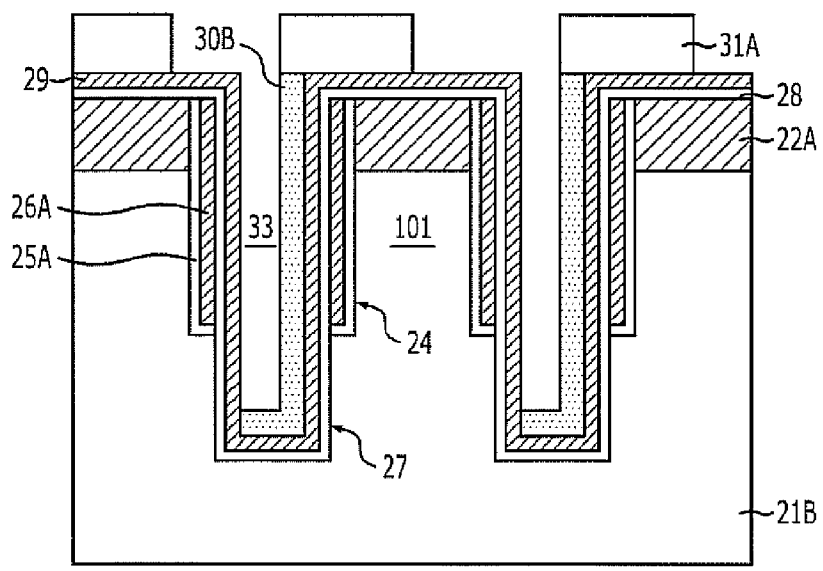

Referring to FIG. 2I, the second hard mask layer 31 is etched using the second photoresist pattern 32 as an etch barrier to form a second hard mask pattern 31A. The second photoresist pattern 32 is removed, and the sacrificial patterns 30A are etched using the second hard mask pattern 31A as an etch barrier.

By etching the sacrificial patterns 30A, remaining sacrificial patterns 30B providing first recesses 33 are formed. Each first recess 33 exposes a portion of the second liner nitride layer 29 formed on the one sidewall of the adjacent active region 101. Thus, the second liner nitride layer 29 is exposed on one sidewall of each first recess 33, and the remaining sacrificial pattern 30B remains over another sidewall and a bottom portion of each first recess 33.

The etch process for forming the first recesses 33 includes performing a dry etch process. Because the remaining sacrificial patterns 30B include undoped polysilicon, the etch process uses a HBr- and $Cl_2$-based compound and obtains a vertical profile by adding oxygen ($O_2$), nitrogen ($N_2$), helium (He), and argon (Ar).

Furthermore, a removal process and a wet etch process may be performed to remove residues, which may remain after the dry etch process is performed. The removal process includes applying plasmas using microwaves and using a gas including $N_2$, $O_2$, and hydrogen ($H_2$). The wet etch process may include using ammonium hydroxide ($NH_4OH$), sulfuric acid ($H_2SO_4$), and hydrogen peroxide ($H_2O_2$).

Figure 2J:
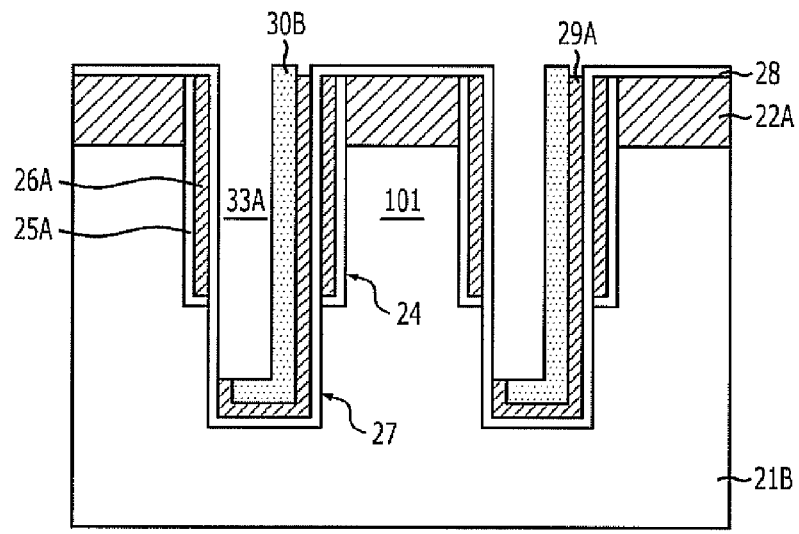

Referring to FIG. 2J, a cleaning process is performed. The second hard mask pattern 31A is removed.

Portions of the second liner nitride layer 29 exposed by the first recesses 33 are selectively removed. To selectively remove the exposed portions of the second liner nitride layer 29, a nitride removal process using a wet etch method is applied. The nitride removal process includes using a mixture of phosphoric acid ($H_3PO_4$) and water ($H_2O$).

After selectively removing the second liner nitride layer 29, remaining second liner nitride layers 29A remain where the remaining sacrificial patterns 30B are in contact. The width of the first recesses 33 is extended sideways by the thickness of the removed portions of the second liner nitride layer 29. Thus, second recesses 33A having an extended width are formed. The second liner oxide layer 28 is exposed on one sidewall of each second recess 33A. The remaining sacrificial pattern 30B remains over another sidewall and a bottom portion of each second recess 33A.

Figure 2K:
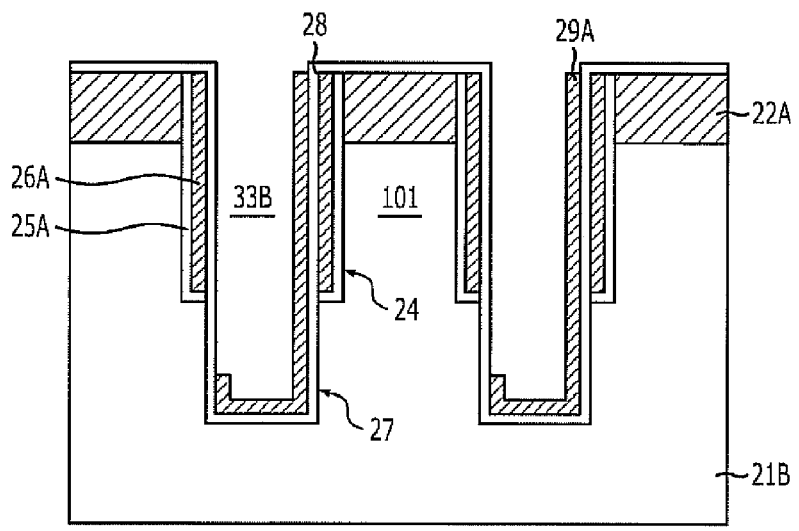

Referring to FIG. 2K, the remaining sacrificial patterns 30B are removed. Consequently, third recesses 33B having a further extended width are formed. The remaining sacrificial patterns 30B are removed using a wet etch process or a dry etch process. The dry etch process includes using a HBr- and $Cl_2$-based compound, and obtains a vertical profile by adding $O_2$, $N_2$, He, and Ar. The wet etch process includes using a high selectivity cleaning solution with respect to nitride and oxide.

Figure 2L:
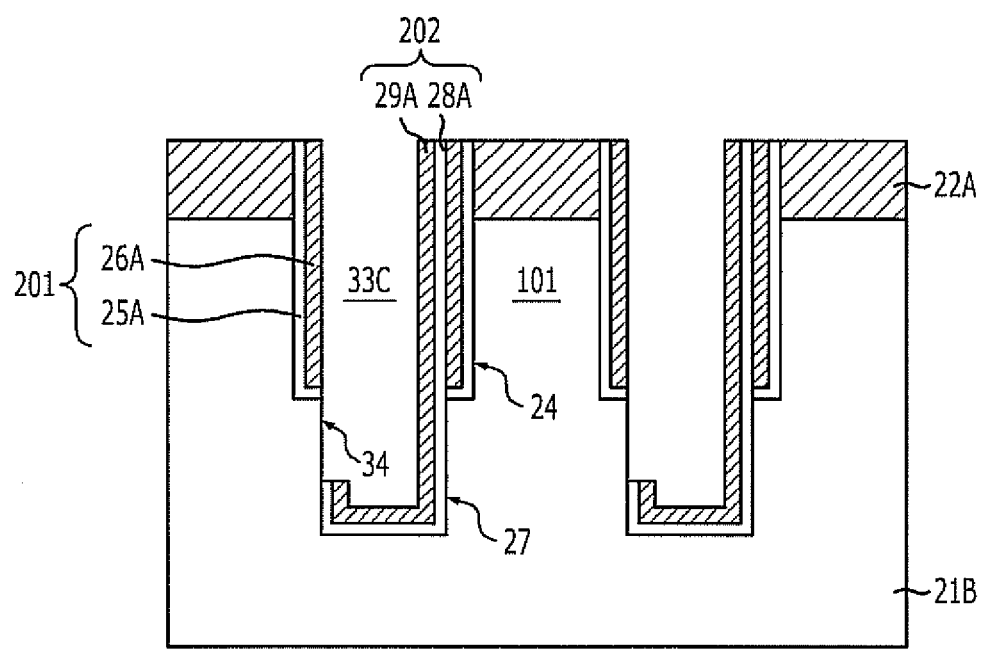

Referring to FIG. 2L, portions of the second liner oxide layer 28 exposed on one sidewall of the third recesses 33B are selectively removed. After selectively removing the second liner oxide layer 28, the width of the third recesses 33B is further extended by the thickness of the removed portions of the second liner oxide layer 28, and the first liner nitride patterns 26A are exposed on one side of fourth recesses 33C having a further extended width. Furthermore, side contacts 34 exposing a portion of one sidewall of the second trenches 27 are formed as the second liner oxide layer 28 is selectively removed. That is, a portion of one sidewall of each second trench 27 formed at the bottom of the active region 101 is exposed and thus the side contact 34 is formed to expose a portion of the one sidewall of each active region 101. The second liner oxide layer 28 may be removed using a cleaning process to form the side contacts 34. For instance, the second liner oxide layer 28 may be selectively removed without damaging the adjacent first liner nitride patterns 26A by performing a wet cleaning process using hydrogen fluoride (HF) and buffered oxide etchant (BOE). Reference denotation 28A represents remaining second liner oxide layers 28A.

The side contacts 34 selectively expose a portion of one of the sidewalls of the second trenches 27, which are part of double trenches. The double trenches include the first trenches 24 and the second trenches 27, formed below the first trenches 24, and have surfaces covered with insulation layers.

The insulation layers are formed to cover surfaces of the active regions 101 except portions where the side contacts 34 are formed. In other words, sidewalls of the first trenches 24 are covered with first insulation layers 201, including the first liner oxide patterns 25A and the first liner nitride patterns 26A. One sidewall of each first trench 24 is further covered with a second insulation layer 202, including the remaining second liner oxide layer 28A and the remaining second liner nitride layer 29A.

Sidewalls of the second trenches 27, except portions where the side contacts 34 are formed, are covered with the second insulation layers 202, including the remaining second liner nitride layers 29A and the remaining second liner oxide layers 28A.

The side contacts 34 are formed to expose a portion of one of the sidewalls of the second trenches 27 where the first insulation layers 201 and the second insulation layers 202 are absent. The second trenches 27 correspond to the bottom portion of the active regions 101. Thus, the side contacts 34 are contacts which selectively expose a portion of one of the sidewalls at the bottom of the active regions 101. The side contacts 34 exposing a portion of one of the sidewalls of the active regions 101 may be referred to as one side contacts (OSC).

In accordance with the exemplary embodiment of the present invention, the side contacts 34 exposing a portion of one of the sidewalls of the active regions 101 are formed. A portion of one of the sidewalls of the active regions 101 exposed by the side contacts 34 become junction regions by subsequently performed processes. The side contacts 34 are regions where the junction regions and buried bit lines come in contact. Also, contact plugs may be coupled to the a portion of one of the sidewalls of the active regions 101 exposed by the side contacts 34.

In accordance with the exemplary embodiment of the present invention, the side contacts 34 selectively exposing one of the sidewalls of the active regions 101 may be formed by performing a double trench process. Furthermore, using the double trench process allows the depth of the side contacts 34 to be controlled with ease. Consequently, the depth of subsequent junction regions may be controlled.

Figure 3:
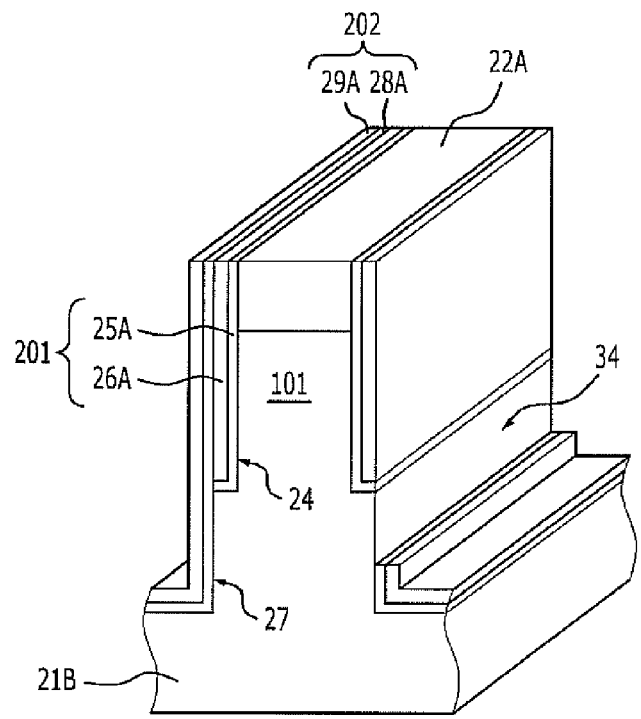
FIG. 3 illustrates a perspective view of a side contact shown in FIG. 2L.

FIG. 3 illustrates a perspective view of a side contact shown in FIG. 2L. The side contact 34 is formed along the one sidewall of the second trench 27. That is, the side contact 34 is formed in a line shape, exposing a portion of the one sidewall of the active region 101.

FIGS. 4A to 4D illustrate cross-sectional views of an example of forming junction regions in accordance with the exemplary embodiment of the present invention.

Figure 4A:
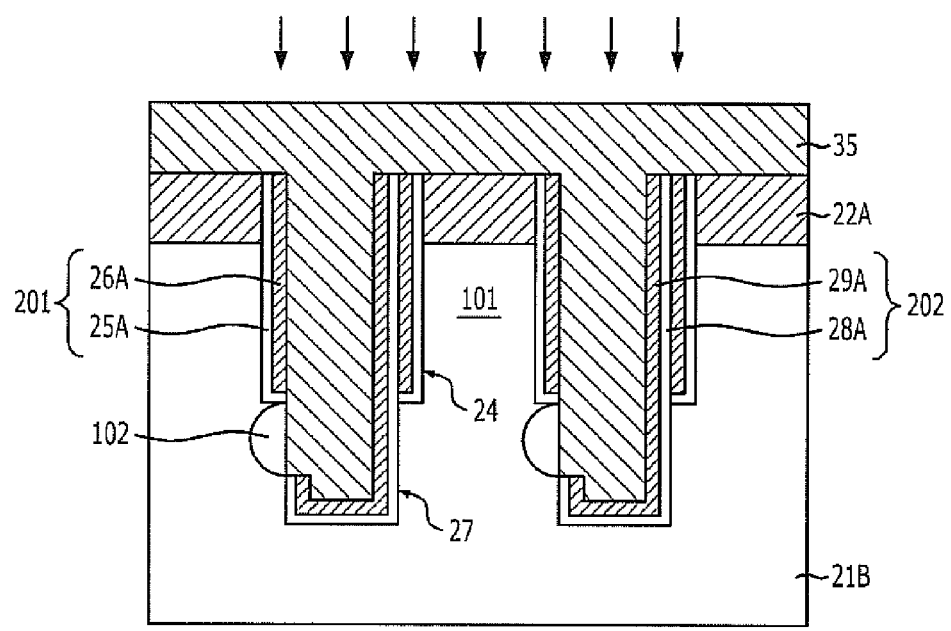
FIGS. 4A to 4D illustrate cross-sectional views of an example of forming junction regions in accordance with the embodiment of the present invention.

Referring to FIG. 4A, after forming the side contacts 34 as shown in FIG. 2L, a dopant supply layer 35 is formed to gap-fill the fourth recesses 33C. At this time, the dopant supply layer 35 is doped with dopants for forming junction regions. For instance, the dopant supply layer 35 includes an insulation layer or a doped polysilicon layer. The insulation layer may include a phosphosilicate glass (PSG) layer having a satisfactory level of fluidity and a certain doping concentration level or greater. Having a satisfactory level of fluidity permits a void-free gap-fill of the fourth recesses 33C, and thus, results in a satisfactory level of dose uniformity in subsequent junction regions. The dopants doped in the dopant supply layer 35 may include N-type impurities, such as phosphorus (P). The dopant supply layer 35 may be formed using a chemical vapor deposition (CVD) method.

An anneal process is performed. At this time, the dopants doped in the dopant supply layer 35 diffuse into the sidewalls of the active regions 101 exposed by the side contacts 34 to form junction regions 102. The junction regions 102 are N-type junctions because the dopants doped in the dopant supply layer 35 include N-type impurities.

For instance, the anneal process is performed in a furnace at a temperature ranging from approximately 500° C. to approximately 1,200° C.

Forming the junction regions 102 by forming the dopant supply layer 35 and performing a thermal diffusion through the anneal process allows the depth of the junction regions 102 and the doping concentration level of the dopants to be controlled with ease.

Figure 4B:
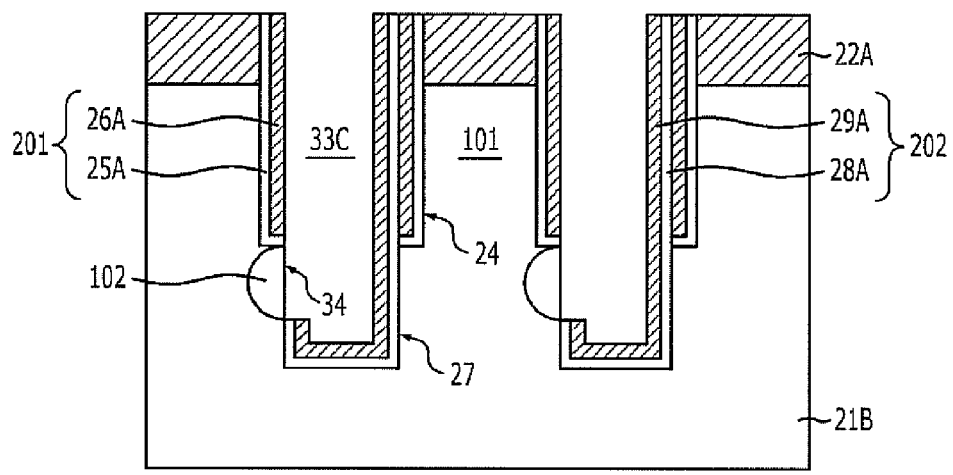

Referring to FIG. 4B, the dopant supply layer 35 is removed. At this time, the dopant supply layer 35 may be removed using one of a wet etch process and a dry etch process. When the dopant supply layer 35 includes a polysilicon layer, the dry etch process uses a HBr- and $Cl_2$-based compound, and obtains a vertical profile by adding $O_2$, $N_2$, He, and Ar. When the wet etch process is performed, a high selectivity cleaning solution with respect to nitride and oxide is used.

Consequently, the fourth recesses 33C are open again. The junction regions 102 are formed in the active regions 101 exposed on one side of the fourth recesses 33C.

Figure 4C:
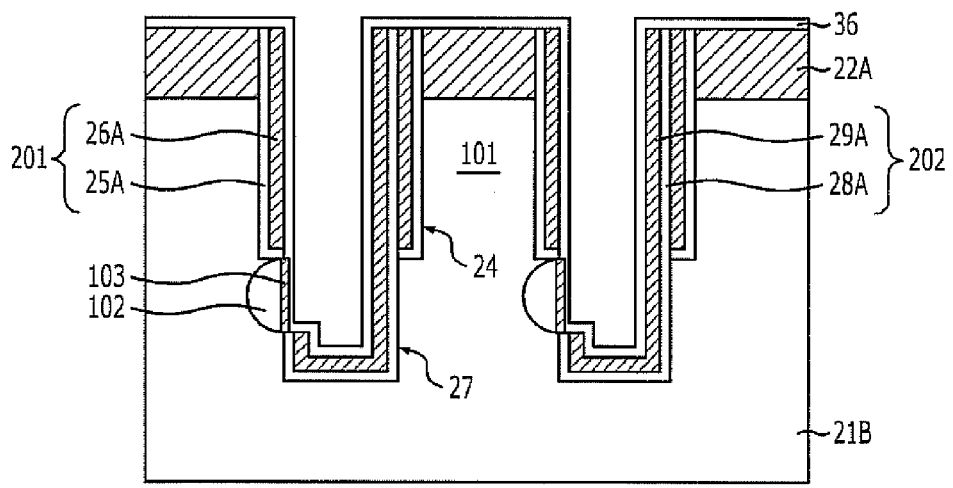

Referring to FIG. 4C, a barrier metal layer 36 is formed and an anneal process is performed to form ohmic-like contacts 103. The barrier metal layer 36 includes a stack structure of a titanium (Ti) layer and a titanium nitride (TiN) layer. Therefore, the ohmic-like contacts 103 may include a titanium silicide layer. The ohmic-like contacts 103 may include metal silicide, such as titanium silicide and nickel silicide.

The ohmic-like contacts 103 are structures which are coupled to one of the sidewalls of the active regions 101.

Figure 4D:
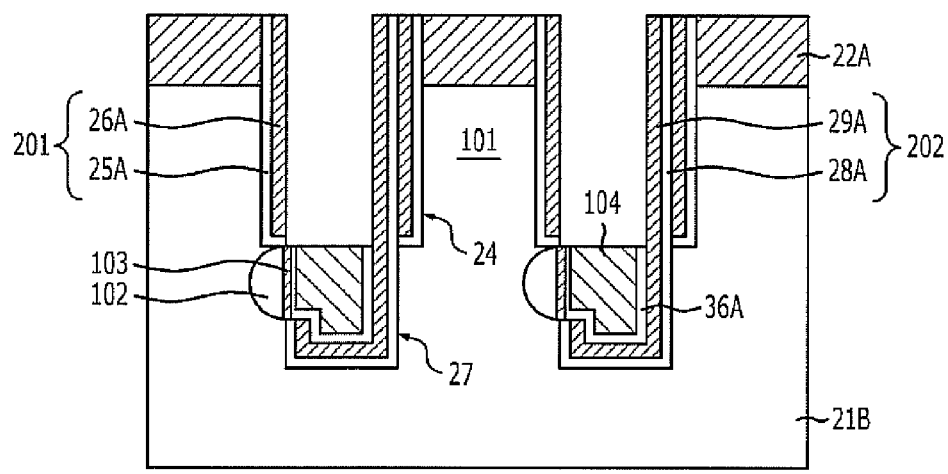

Referring to FIG. 4D, a bit line conductive layer is formed over the barrier metal layer 36 in a manner that the bit line conductive layer is buried over the fourth recesses 33C (FIG. 4B). An etch-back process is performed on the bit line conductive layer up until the ohmic-like contacts 103 are reached. Consequently, buried bit lines 104, which are coupled to the junction regions 102 through the ohmic-like contacts 103 are formed. The buried bit lines 104 are arranged side by side with the active regions 101. The barrier metal layer 36 is etched at substantially the same time during the etch-back process of the bit line conductive layer. Reference denotation 36A represents a remaining barrier metal pattern 36A. The buried bit lines 104 may have a height which fills the second trenches 27 because the height of the buried bit lines 104 may be controlled up to the height of the ohmic-like contacts 103. The buried bit lines 104, except portions of the buried bit lines 104 coupled to the junction regions 102, are insulated from the remaining substrate 21B by the remaining second liner oxide layers 28A and the remaining second liner nitride layers 29A.

The buried bit lines 104 have a low resistance because the buried bit lines 104 include a metal layer. Furthermore, one buried bit line 104 coupled to one junction region 102 may be advantageous for a large-scale integration.

Figure 5A:
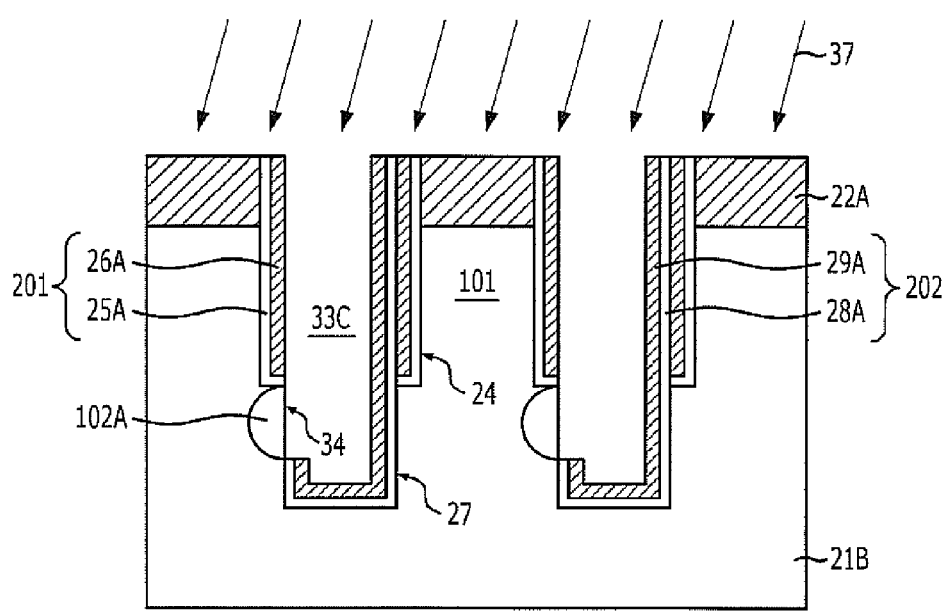
FIGS. 5A to 5C illustrate cross-sectional views of another example of forming junction regions in accordance with the embodiment of the present invention.
Figure 5B:
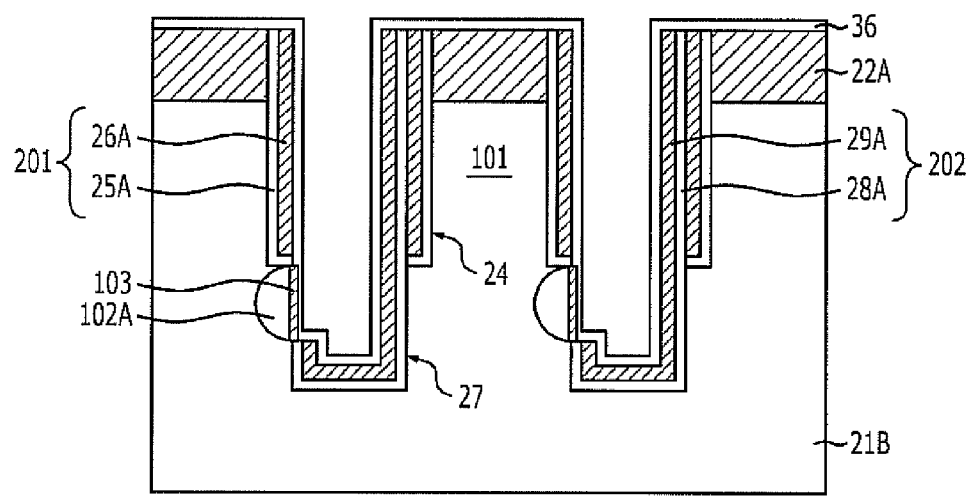
Figure 5C:
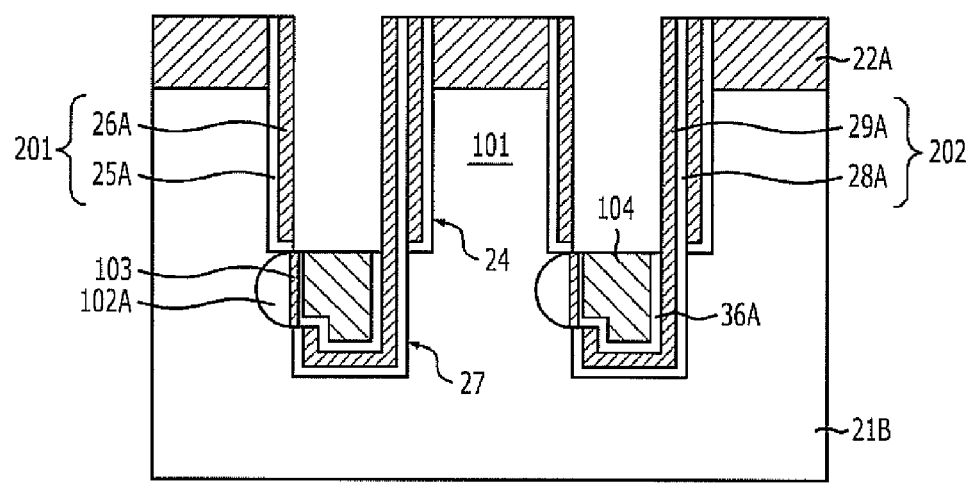

FIGS. 5A to 5C illustrate cross-sectional views of another example of forming junction regions in accordance with the exemplary embodiment of the present invention.

Referring to FIG. 5A, after forming the side contacts 34 as shown in FIG. 2L, a tilted ion implantation process 37 is performed to form junction regions 102A on one side of the active regions 101 exposed by the side contacts 34. The junction regions 102A may be formed by implanting ions of N-type impurities during the tilted ion implantation process 37. The N-type impurities may include P, and a doping concentration level ranging from approximately $1 \times 10^{19}$ atoms/$cm^3$ to approximately $1 \times 10^{22}$ atoms/$cm^3$ may be used.

Referring to FIG. 5B, a barrier metal layer 36 is formed and an anneal process is performed to form ohmic-like contacts 103. The barrier metal layer 36 may include a stack structure of a Ti layer and a TiN layer. Therefore, the ohmic-like contacts 103 may include a titanium silicide layer.

The ohmic-like contacts 103 are structures which are coupled to one of the sidewalls of the active regions 101.

Referring to FIG. 5C, a bit line conductive layer is formed over the barrier metal layer 36 in a manner that the bit line conductive layer is buried over the fourth recesses 33C (FIG. 5A). An etch-back process is performed on the bit line conductive layer up until the ohmic-like contacts 103 are reached. Consequently, buried bit lines 104, which are coupled to the junction regions 102A through the ohmic-like contacts 103, are formed. The buried bit lines 104 are arranged side by side with the active regions 101. The barrier metal layer 36 is etched at substantially the same time during the etch-back process of the bit line conductive layer. Reference denotation 36A represents a remaining barrier metal pattern 36A. The buried bit lines 104 may have a height which fills the second trenches 27 because the height of the buried bit lines 104 may be controlled up to the height of the ohmic-like contacts 103. The buried bit lines 104, except portions of the buried bit lines 104 coupled to the junction regions 102A, are insulated from the remaining substrate 21B by the remaining second liner oxide layers 28A and the remaining second liner nitride layers 29A.

The buried bit lines 104 have a low resistance because the buried bit lines 104 include a metal layer. Furthermore, one buried bit line 104 coupled to one junction region 102A may be advantageous for a large-scale integration.

According to the embodiments of the present invention, the process for forming the side contact which selectively exposes one sidewall of the active region may be simplified by forming the double trench.

Furthermore, forming the double trench allows the side contacts to be formed to a uniform depth. Consequently, the junction region formed in one sidewall of the active region exposed by the side contact may be formed to a uniform depth and dose.

Moreover, the simplified process of forming the side contact minimizes physical damage occurring on the active region where the junction region is to be formed.

According to the embodiments of the present invention, the buried bit lines are formed using a metal layer, and thus, the resistance is lessened. Therefore, a semiconductor device with less operation characteristic deterioration may be embodied even when the device is miniaturized.

In conclusion, the exemplary embodiments of the present invention are advantageous for a large-scale integration, in order to cope with the design rule of $4F^2$, where F represents the minimum feature size. Further, because the process for forming a three-dimensional cell may be simplified, the cost and time utilized to produce a structure including one cell and one bit line may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
  forming a double trench including a first trench and a second trench formed below the first trench and having surfaces covered with insulation layers;
  removing portions of the insulation layers to form a side contact exposing a portion of one sidewall of the second trench;
  forming a junction region in an active region adjacent to the portion of the one sidewall exposed by the side contact; and
  forming a buried bit line buried over the second trench and coupled to the junction region,
  wherein the forming of a buried bit line comprises;
    forming a barrier metal layer;
    forming a metal silicide on an interface between the junction region and the barrier metal layer;
    forming a metal layer over the barrier metal layer to fill the first trench and the second trench; and
    performing an etch-back process on the metal layer.

2. The method of claim 1, wherein the second trench has a depth smaller than that of the first trench.

3. The method of claim 1, wherein the removing of portions of the insulation layers to form the side contact comprises:
  forming a sacrificial layer over the insulation layers to gap-fill the double trench;
  etching portions of the sacrificial layer to form a recess exposing the insulation layers formed on one sidewall of the double trench; and
  removing portions of the insulation layers exposed by the recess and exposing a portion of one sidewall of the second trench.

4. The method of claim 1, wherein the removing of portions of the insulation layers to form the side contact comprises exposing a portion of the one sidewall of the second trench in a line shape.

5. A method for fabricating a semiconductor device, comprising:
  etching a substrate to form a first trench;
  forming a first insulation layer on sidewalls of the first trench;
  etching a bottom surface of the first trench to form a second trench;
  forming a second insulation layer over the substrate structure;
  etching portions of the second insulation layer to form a side contact exposing a portion of one sidewall of the second trench;
  forming a junction region in the active region adjacent to a portion of the one sidewall exposed by the side contact; and
  forming a buried bit line buried over the second trench and coupled to the junction region,
  wherein the forming of a buried bit line comprises:
    forming a barrier metal layer;
    forming a metal silicide on an interface between the junction region and the barrier metal layer;
    forming a metal layer over the barrier metal layer to fill the first trench and the second trench; and
    performing an etch-back process on the metal layer.

6. The method of claim 5, wherein a plurality of active regions isolated from each other by the first trench and the second trench are formed.

7. The method of claim 5, wherein the forming of the junction region comprises:
  forming a dopant supply layer doped with dopants; and
  diffusing the dopants using an anneal process to form the junction region.

8. The method of claim 7, wherein the dopant supply layer comprises a doped polysilicon layer.

9. The method of claim 5 a wherein the forming of the junction region comprises performing a tilted ion implantation process.

10. The method of claim 5, wherein the etching of portions of the second insulation layer to form the side contact comprises:
- forming a sacrificial layer over the second insulation layer to gap-fill the first trench and the second trench;
- planarizing the sacrificial layer;
- etching portions of the sacrificial layer, after the planarizing, to form a recess using a contact mask; and
- removing the remaining sacrificial layer and portions of the second insulation layer.

11. The method of claim 5, wherein each of the first insulation layer and the second insulation layer comprises a stack structure of a liner oxide layer and a liner nitride layer.

12. A method for fabricating a semiconductor device, comprising:
- etching a substrate to form a first trench;
- forming a first insulation layer on sidewalls of the first trench;
- etching a bottom surface of the first trench to form a second trench using the first insulation layer as a mask;
- forming a second insulation layer over the first insulation layer and the exposed substrate by the second trench;
- etching portions of the second insulation layer to form a side contact exposing a portion of one sidewall of the second trench;
- wherein each of the first insulation layer and the second insulation layer comprises a stack structure of a liner oxide layer and a liner nitride layer.

13. The method of claim 12, wherein a plurality of active regions isolated from each other by the first trench and the second trench are formed.

14. The method of claim 13, further comprising forming a junction region in the active region adjacent to a portion of the one sidewall exposed by the side contact.

15. The method of claim 14, wherein the forming of a junction region comprises:
- forming a dopant supply layer doped with dopants; and
- diffusing the dopants using an anneal process to form the junction region.

16. The method of claim 12, wherein the etching of portions of the second insulation layer to form the side contact comprises:
- forming a sacrificial layer over the second insulation layer to gap-fill the first trench and the second trench;
- planarizing the sacrificial layer;
- etching portions of the sacrificial layer, after the planarizing, to form a recess using a contact mask; and
- removing the remaining sacrificial layer and portions of the second insulation layer.

17. The method of claim 14, further comprising forming a buried bit line buried over the second trench and coupled to the junction region after the forming the junction region.

18. The method of claim 17, wherein the forming of the buried bit line comprises:
- forming a barrier metal layer;
- forming a metal silicide on an interface between the junction region and the barrier metal layer;
- forming a metal layer over the barrier metal layer to fill the first trench and the second trench; and
- performing an etch-back process on the metal layer.

* * * * *